United States Patent
Brown

(10) Patent No.: US 6,529,436 B1
(45) Date of Patent: Mar. 4, 2003

(54) SUPPLY DEGRADATION COMPENSATION FOR MEMORY SELF TIME CIRCUITS

(75) Inventor: Jeffrey S. Brown, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 50 days.

(21) Appl. No.: 09/844,299

(22) Filed: Apr. 26, 2001

(51) Int. Cl.$^7$ .................................................. G11C 7/00
(52) U.S. Cl. ........................ 365/226; 365/233; 365/210; 365/207
(58) Field of Search ................................. 365/226, 233, 365/210, 207

(56) References Cited

U.S. PATENT DOCUMENTS

| | | | | |
|---|---|---|---|---|
| 5,452,253 A | * | 9/1995 | Choi | 365/201 |
| 5,941,990 A | * | 8/1999 | Hiiragizawa | 713/310 |
| 6,181,626 B1 | | 1/2001 | Brown | 365/210 |
| 6,185,139 B1 | * | 2/2001 | Pantelakis et al. | 365/201 |
| 6,434,078 B1 | * | 8/2002 | Morishita | 365/227 |

* cited by examiner

Primary Examiner—Richard Elms
Assistant Examiner—Tuan T. Nguyen
(74) Attorney, Agent, or Firm—Christopher P. Maiorana, PC

(57) ABSTRACT

A self-timing memory circuit with supply degradation compensation comprising a first self-timing circuit and a second self-timing circuit. The first self-timing circuit may be configured to generate a first signal that may be minimally affected by power supply degradation and/or variation. The second self-timing circuit may be configured to generate a second signal, where an effect of the power supply degradation and/or variation on the second signal is maximized.

18 Claims, 2 Drawing Sheets

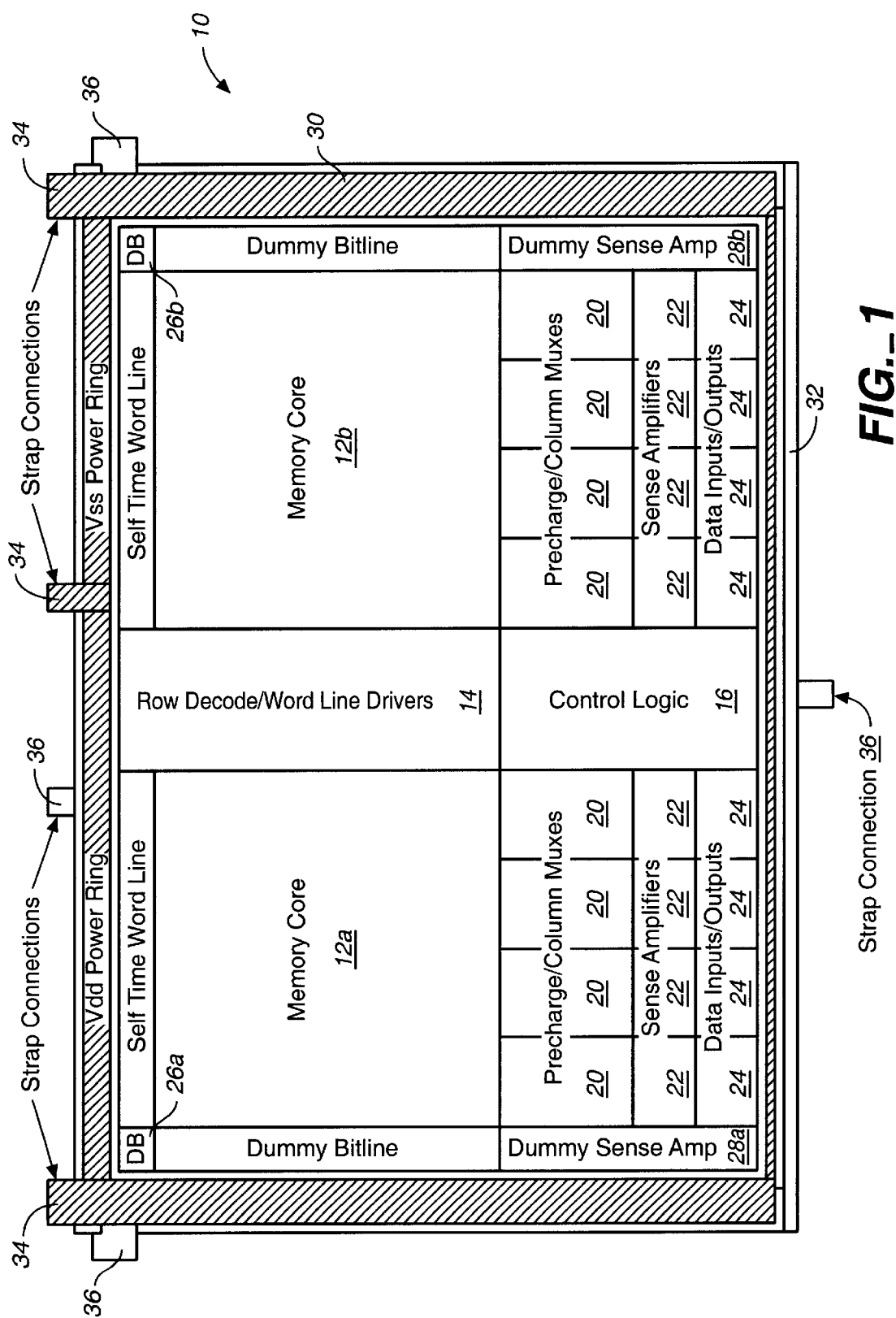
FIG._1

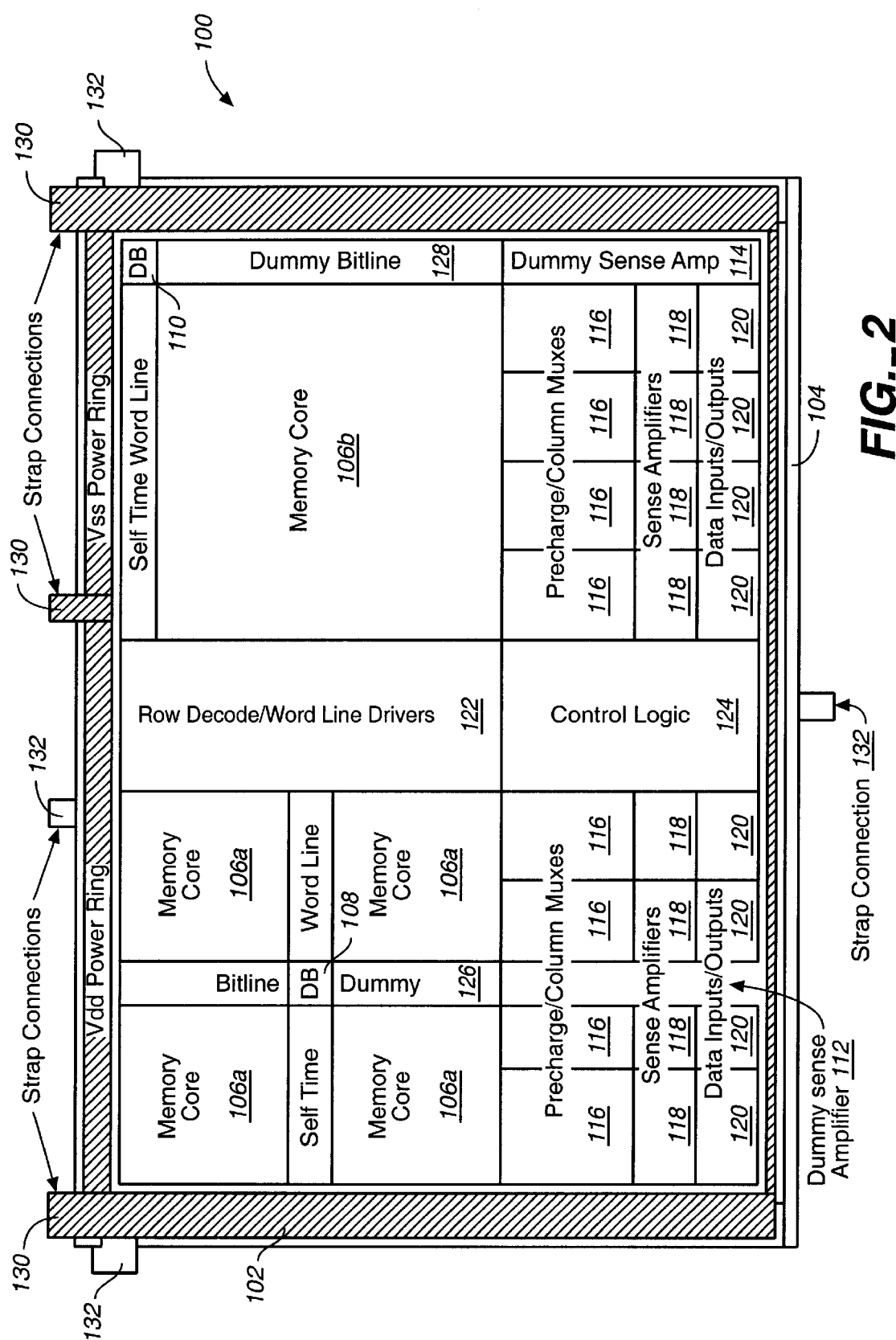
FIG._2

SUPPLY DEGRADATION COMPENSATION FOR MEMORY SELF TIME CIRCUITS

FIELD OF THE INVENTION

The present invention relates to a method and/or architecture for memory self time circuits generally and, more particularly, to a method and/or architecture for power supply degradation compensation for memory self time circuits.

BACKGROUND OF THE INVENTION

Referring to FIG. 1, a block diagram of a memory device 10 having a dual dummy path architecture is shown. The memory device 10 includes a first memory core 12a and a second memory core 12b, each having an array of memory cells for storage and retrieval of data. The array of memory cells is arranged in rows and columns. The rows of memory cells are coupled through wordlines and the columns of memory cells are coupled through bitlines. Each column can have a single bitline (for single-ended memory cells) or a complementary bitline pair (for dual-ended memory cells). The memory device 10 includes a row or wordline decoder 14 (including a plurality of wordline drivers), a control logic circuit 16, and a number of precharge/column multiplexer circuits 20 that decode an address for accessing a particular location of the memory arrays 12a and 12b. Sense amplifiers 22 are enabled to sense the data from the memory cells in the array on the bitlines or bitline pairs. The sense amplifiers 22 present the data to a number of latches 24.

The latching of the data must be delayed for a period of time after an access cycle commences to ensure that the data from the sense amplifiers 22 is valid. Part of the delay is the result of RC delay in the wordlines due to the capacitance of the memory cells that are electrically coupled to the wordlines in each row. Similarly, RC delay is also produced in the columns of the memory cores 12a and 12b due to the capacitance of the memory cells that are electrically coupled to the bitlines in each column. Each access to a particular memory cell includes (i) a delay between the assertion of the wordline corresponding to the memory cell and the activation of the memory cell, and (ii) a delay between the activation of the memory cell and the discharge of the bitline or bitline pair to which it is connected. The data from the sense amplifiers 22 is not valid until after the delays have expired.

Timing control can be implemented to prevent the latching of the data from the sense amplifiers 22 prior to the expiration of an appropriate delay. A worst-case delay can be used to ensure that the data being latched is valid. In addition, the sense amplifiers 22 can consume an appreciable amount of power while activated. The-timing control can be provided to deactivate (shut down) the data sense amplifiers 22 as soon as possible after the data has been latched.

A conventional method for providing the timing control for the data sense amplifiers 22 is the inclusion of self-timing circuitry. The self-timing circuitry can provide a timing control signal that indicates when data from the sense amplifiers 22 of the memory cores 12a and 12b can be latched and when the sense amplifiers 22 can be deactivated. The self-timing circuitry of the memory device 10 includes a dummy bitcell 26a, a dummy bitcell 26b, a dummy sense amplifier 28a, and a dummy sense amplifier 28b. The dummy bitcells 26a and 26b are located in the upper outer corners of the memory cores 12a and 12b, respectively, since a memory cell that is located furthest from a given wordline driver and a given sense amplifier 22 can have the worst-case RC delay. As used herein, the term dummy bitcell refers to a bitcell that is implemented to simulate the operational delays of the other (real) bitcells of the memory device 10. The term dummy sense amplifier refers to a sense amplifier that is implemented in conjunction with a dummy bitcell to simulate the operational delays of the other (real) sense amplifiers 22 of the memory device 10.

The RC delays of the memory cores 12a and 12b are not the only sources of delay in the memory device 10 that can cause failure. Any sources of variation that make the memory self time path delay differ from the actual memory path delay can result in a memory failure. One such source of variation is power supply degradation.

The memory device 10 has a power ring 30 connected to a supply voltage VDD and a power ring 32 connected to a supply ground VSS. The power rings 30 and 32 are positioned around the periphery of the memory 10. The power ring 30 may receive the supply voltage VDD via a number of strap connections 34. The power ring 32 may receive the supply ground VSS via a number of strap connections 36. The supply voltage VDD and the supply ground VSS can be the power supply voltage and ground, respectively, for the memory device 10.

Because of the close proximity of the dummy bitcells 26a and 26b and dummy sense amplifiers 28a and 28b to the power supply rings 30 and 32, the supply voltage VDD and the supply ground VSS presented to the dummy bitcells 26a and 26b and dummy sense amplifiers 28a and 28b are at the most ideal levels. However, the supply voltage VDD and the supply ground VSS presented to the real bitcells and sense amplifiers 22 of the memory device 10 can be degraded (i.e., at less than ideal levels). The degradation of the supply voltage VDD and/or the supply ground VSS can cause the data path (i.e., the real bitcells and/or the real sense amplifiers 22) to have a slower read than the self time path (i.e., the dummy bitcells 26a and 26b and the dummy sense amplifiers 28a and 28b).

A conventional method for memory array self time path delay compensation includes the addition of a delay (e.g., a delay string) to compensate for any variation caused by sources that make the memory self time path delay different than the actual memory path delay. One source of the delay variation is the variation in a supply voltage and/or a supply ground between the elements in the memory self time path (i.e., the dummy bitcells 26a and 26b, the dummy sense amplifiers 28a and 28b, the self time wordline, etc.) and the elements in the memory data path (i.e., bitlines, wordlines, sense amplifiers 22, etc.).

However, the added delay string can have a voltage dependency that does not track the voltage dependency of the memory self time path. In addition, some analog sense amplifiers can have a steep performance rolloff as the power supply voltage VDD drops extremely low. Although the sense amplifiers 22 may still function at extremely low supply voltage VDD, if the delay for activation of the sense amplifier 22 is a strong function of the supply voltage VDD, any variation between the supply voltage VDD to the actual sense amplifiers 22 and the supply voltage to the dummy sense amplifiers 28a and 28b can have a high probability of causing the memory 10 to fail. The steep performance rolloff at low supply voltages exhibited by some analog sense amplifier architectures cannot be adequately compensated for by the addition of a delay string.

It would be desirable to have a method and/or architecture for memory self time circuits that compensates for supply voltage variations and degradation.

SUMMARY OF THE INVENTION

The present invention concerns a self-timing memory circuit with supply degradation compensation comprising a first self-timing circuit and a second self-timing circuit. The first self-timing circuit may be configured to generate a first signal that may be minimally affected by power supply degradation and/or variation. The second self-timing circuit may be configured to generate a second signal, where an effect of the power supply degradation and/or variation on the second signal is maximized.

The objects, features and advantages of the present invention include providing a method and/or architecture for power supply degradation compensation for memory self time circuits that may (i) improve the stability of memory self time circuits at low level supply voltages, (ii) compensate for analog sense amplifier rolloff, (iii) ensure that valid data is latched, (iv) ensure that sense amplifiers are not turned off prematurely, and/or (v) compensate for worst case supply voltage and/or ground degradation.

BRIEF DESCRIPTION OF THE DRAWINGS

These and other objects, features and advantages of the present invention will be apparent from the following detailed description and the appended claims and drawings in which:

FIG. 1 is a block diagram of a memory device with self time circuitry; and

FIG. 2 is a diagram of a memory device in accordance with a preferred embodiment of the present invention.

DETAILED DESCRIPTION OF THE PREFERRED EMBODIMENTS

Referring to FIG. 2, a diagram of a memory device 100 implemented in accordance with a preferred embodiment of the present invention is shown. The memory device 100 may be implemented with a self-timing memory circuit configured to compensate for power supply degradation and/or variation. The memory device 100 may be implemented similarly to the memory device 10 except that the memory device 100 may have (i) a first self-timing timing circuit that is positioned similarly to a self-timing circuit of the memory device 10 and (ii) a second self-timing circuit that is positioned in a location where any degradation and/or variation of the power supply may have a maximum effect on the self time path delay.

The memory device 100 may have a power supply ring 102, a power supply ground ring 104, a memory core 106a, a memory core 106b, a dummy bitcell 108, a dummy bitcell 110, a dummy sense amplifier 112, a dummy sense amplifier 114, a number of precharge/column multiplexer circuits 116, a number of sense amplifiers 118, a number of data input/outputs 120, a row decoder and wordline driver circuit 122, and a control logic circuit 124. The dummy bitcells 108 and 110 may be coupled to the dummy sense amplifiers 112 and 114 via dummy bitlines (or bitline pairs) 126 and 128, respectively. In one example, the dummy sense amplifiers 112 and 114 and the real sense amplifiers 118 may be implemented as analog sense amplifiers.

The power supply ring 102 and the power supply ground ring 104 may, in one example, be positioned at the periphery of the memory device 100. The power supply ring 102 may have one or more strap connections 130. The power supply ground ring 104 may have one or more strap connections 132. In one example, the power supply ring 102 may be implemented with three strap connections 130 and the power supply ground ring 104 may be implemented with four strap connections 132. However, other numbers of strap connections 130 and 132 may be implemented accordingly to meet the design criteria of a particular application.

In one example, the memory device 100 may be implemented with the dummy bitcell 108 positioned centrally within the memory core 106a and the dummy sense amplifier 112 positioned centrally within the sense amplifiers 118 of the I/O block (e.g., the precharge/column multiplexer circuits 116, the sense amplifiers 118 and the data inputs/outputs 120) coupled to the memory core 106a. Positioning the dummy bitcell 108 centrally in the memory core 106a and the dummy sense amplifier 112 centrally among the sense amplifiers 118 may (i) maximize the resistance effects on the supply voltage VDD of the self time circuit elements, (ii) compensate for a worst case rise of the supply ground VSS in the dummy bitcell 108 (e.g., lowered pull down strength on the dummy bitline 126), and (iii) compensate for the supply voltage VDD and/or the supply ground VSS degradation effects on the dummy sense amplifier 112. The locations of the dummy bitcell 108 and the dummy sense amplifier 112 are generally selected to maximize the effects of power supply degradation and/or variation on the self time path delay. The self time path including the dummy bitcell 108 and the dummy sense amplifier 112 may be configured to generate a timing control signal that may cover cases where supply degradation and/or variation have a substantial (e.g., significant) effect on the self time path delay.

The dummy bitcell 110 and the dummy sense amplifier 114 may be positioned within the memory core 106b similarly to the dummy bitcell 26b and the dummy sense amplifier 28b of FIG. 1. The self time path including the dummy bitcell 110 and the dummy sense amplifier 114 may be configured to generate a timing control signal that may cover cases where supply voltage VDD degradation and/or variation has minimal (e.g., little or no) effect on the self time path delay.

During an access operation of the memory device 100, the worst case delay as represented by either (i) the first self time path delay (e.g., the dummy bitcell 108 and the dummy sense amplifier 112) or (ii) the second self time path delay (e.g., the dummy bitcell 110 and the dummy sense amplifier 114) may be used to control the latching of the outputs 120 and shut down operations of the sense amplifiers 118. When the dominant factor in the access delay of the memory device 100 is the steep nonlinear performance rolloff of analog sense amplifiers, the self time architecture of the present invention may ensure that (i) valid data is latched and (ii) the sense amplifiers 118 are not turned off prematurely.

The present invention may compensate for degradation and/or variations in the supply voltage VDD and/or supply ground VSS that may impede the reliability of conventional self time architectures. The present invention may compensate for degradation and/or variation of the supply voltage VDD and/or the supply ground VSS. The present invention may be implemented in memory architectures that have significant supply voltage VDD and/or supply ground VSS variation (e.g., memory architectures having peripheral power rings).

In an alternative embodiment of the present invention, the memory device 100 may be implemented with the dummy bitcells 108 and 110 and the dummy sense amplifiers 112 and 114 positioned similarly to the dummy bitcells 26a and 26b and the dummy sense amplifiers 28a and 28b of FIG. 1.

However, unlike the dummy bitcell 26a and the dummy sense amplifier 28a, the power supply for the dummy bitcell 108 and the dummy sense amplifier 112 may be taken from a point in the power distribution of the memory device 100 where the degradation and/or variation is maximized.

In another alternative embodiment, additional strap connections 130 and 132 may be implemented. The additional strap connections may minimize the supply voltage VDD and/or the supply ground VSS degradation across the memory core. However, die area, pad area, cost, and other considerations may limit the number of the strap connections that may be implemented.

While the invention has been particularly shown and described with reference to the preferred embodiments thereof, it will be understood by those skilled in the art that various changes in form and details may be made without departing from the spirit and scope of the invention.

What is claimed is:

1. A self-timing memory circuit with supply degradation compensation comprising:
   a first self-timing circuit configured to measure a first delay substantially unaffected by power supply degradation and/or variation;
   a second self-timing circuit configured to measure a second delay substantially affected by said power supply degradation and/or variation; and
   a control circuit configured to control a sense amplification read of a memory core in response to said first delay and said second delay, wherein said control circuit is configured to select a delay for controlling said sense amplification read in response to the longer of said first delay or of said second delay.

2. The self-timing memory circuit according to claim 1, wherein said control circuit is further configured to control a latching of data from said read in response to said first delay and said second delay.

3. The self-timing memory circuit according to claim 1, wherein said control circuit is configured to shut down one or more sense amplifiers in response to said first delay and said second delay.

4. The self-timing memory circuit according to claim 1, wherein said first self-timing circuit comprises:
   a dummy bitcell electrically coupled to a dummy wordline and at least one dummy bitline; and
   a dummy sense amplifier coupled to the dummy bitline and configured to provide said first delay, wherein said first delay is used to control a sense amplifier of a memory core.

5. The self-timing memory circuit according to claim 1, wherein said second self-timing circuit comprises:
   a dummy bitcell electrically coupled to a dummy wordline and at least one dummy bitline; and
   a dummy sense amplifier coupled to the dummy bitline and configured to provide said second delay, wherein said second delay is used to control a sense amplifier of a memory core.

6. The self-timing memory circuit according to claim 5, wherein said dummy bitcell is disposed toward the center of said memory core.

7. The self-timing memory circuit according to claim, 5 wherein said dummy sense amplifier is disposed toward the center of an input/output block coupled to said miemory core.

8. The self-timing memory circuit according to claim 5, wherein said dummy betcell is set to a first logic level.

9. The self-timing memory circuit according to claim 5, wherein said dummy bitcell simulates a bitcell of the memory core.

10. The self-timing memory circuit according to claim 5, wherein the dummy bitcell is a single-ended bitcell or a dual-ended bitcell.

11. A memory device comprising:
   means for generating a first timing control signal that is substantially unaffected by power supply degradation and/or variation;
   means for generating a second timing control signal that is substantially affected by said power supply degradation and/or variation on said second timing control signal; and
   means for controlling a sense amplification read of a memory core in response to said first timing control signal and said second timing control signal, wherein said controlling means is configured to select a delay for controlling said sense amplification read in response to the longer of a delay of said first timing control signal or a delay of said second timing control signal.

12. A method for compensating a self-timing circuit of a memory device for power supply degradation and/or variation comprising the steps of:
   (A) measuring a first self time path delay of a memory core substantially unaffected by power supply degradation and/or variation;
   (B) measuring a second self time path delay of a memory core that is substantially affected by power supply degradation and/or variation; and
   (C) timing an operation of said memory device based on the longer of said first and said second delays.

13. The method according to claim 12, wherein step A comprises the sub-step of:
   simulating an operation of a bitcell of said memory device.

14. The method according to claim 12, wherein step B comprises the sub-step of:
   simulating an operation of a bitcell of said memory device.

15. The method according to claim 12, wherein step C comprises the sub-step of:
   latching data based on said first and said second measurements.

16. The method according to claim 12, wherein step C comprises the sub-step of:
   deactivating a sense amplifier based on said first and said second measurements.

17. The method according to claim 12, further comprising the step of:
   compensating for a performance rolloff of an analog sense amplifier due to power supply degradation and/or variation.

18. The method according to claim 12, wherein said measuring steps comprise the sub-step of:
   simulating an operation of a sense amplifier of said memory device.

* * * * *